(12) United States Patent
Yamane et al.

(10) Patent No.: US 8,362,786 B2
(45) Date of Patent: Jan. 29, 2013

(54) METHOD AND DEVICE FOR DETERMINING DEGRADATION STATE OF ELECTRICAL STORAGE DEVICE IN HYBRID CONSTRUCTION EQUIPMENT

(75) Inventors: Jun Yamane, Hiratsuka (JP); Takayoshi Endou, Hiratsuka (JP); Tomohisa Sato, Hiratsuka (JP)

(73) Assignee: Komatsu Ltd., Tokyo (JP)

( * ) Notice: Subject to any disclaimer, the term of this patent is extended or adjusted under 35 U.S.C. 154(b) by 314 days.

(21) Appl. No.: 12/933,233

(22) PCT Filed: Mar. 16, 2009

(86) PCT No.: PCT/JP2009/055062
§ 371 (c)(1),
(2), (4) Date: Sep. 17, 2010

(87) PCT Pub. No.: WO2009/116495
PCT Pub. Date: Sep. 24, 2009

(65) Prior Publication Data
US 2011/0018551 A1 Jan. 27, 2011

(30) Foreign Application Priority Data
Mar. 21, 2008 (JP) .................................. 2008-073602

(51) Int. Cl.
*G01R 31/12* (2006.01)
(52) U.S. Cl. ........................................ 324/548; 324/537
(58) Field of Classification Search .................. 324/537, 324/548; 320/166, 167; 318/751, 794
See application file for complete search history.

(56) References Cited

FOREIGN PATENT DOCUMENTS

| JP | 4-325834 | 11/1992 |
|---|---|---|
| JP | 6-242193 | 9/1994 |
| JP | 2000-13910 | 1/2000 |
| JP | 2001-163129 A1 | 6/2001 |
| JP | 2004-72927 A1 | 3/2004 |
| JP | 2004-236381 A1 | 8/2004 |
| JP | 2004-271445 A1 | 9/2004 |
| JP | 2005-77128 A1 | 3/2005 |
| JP | 2007-155586 A1 | 6/2007 |
| WO | WO 2006/106681 A1 | 10/2006 |

OTHER PUBLICATIONS

International Search Report for International Application No. PCT/JP2009/055062 dated Jun. 10, 2009.

*Primary Examiner* — Vincent Q Nguyen
(74) *Attorney, Agent, or Firm* — Kratz, Quintos & Hanson, LLP

(57) ABSTRACT

The degradation of an electrical storage device 30 such as a capacitor can be determined by a system which is not an external device but is installed in hybrid construction equipment 1 in a state that the electrical storage device 30 such as a capacitor is mounted. To achieve this objective, it is at least checked that the working machine has stopped. Next, when it has been checked that the working machine has stopped, a degradation state determination time control mode is entered, a motor-generator is driven at the prescribed rotational speed and the prescribed torque, and the electrical storage device rises from the prescribed start charging voltage to the prescribed end charging voltage (Step 102). Next, the capacitance of the electrical storage device is calculated based on the values of the rotational speed and the torque of the motor-generator during the degradation state determination time control mode, the values of the start charging voltage and the end charging voltage of the electrical storage device, and the time needed for the electrical storage device to reach the end charging voltage form the start charging voltage. Next, by comparing the calculated capacitance of the electrical storage device and the reference capacitance, the degradation state of the electrical storage device is determined.

9 Claims, 8 Drawing Sheets

METHOD AND DEVICE FOR DETERMINING DEGRADATION STATE OF ELECTRICAL STORAGE DEVICE IN HYBRID CONSTRUCTION EQUIPMENT

TECHNICAL FIELD

The present invention relates to a hybrid construction equipment having an engine, a motor-generator, electrical storage device, and a working machine, and more particularly, to a method and a device capable of determining the degradation state of an electrical storage device such as a capacitor.

BACKGROUND ART

In recent years, hybrid cars have been developed also in the field of construction equipment, just like in the field of ordinary automobiles. The hybrid construction equipment of this type is provided with an engine, a motor-generator, an electrical storage device, and a working machine. Here, the electrical storage device is a battery capable of charging and discharging freely, and is constituted by a capacitor or a secondary battery. It should be noted that the present invention will be explained using a capacitor as a representative of the electrical storage devices hereinafter. A capacitor as the electrical storage device stores electric power which is generated when the motor-generator performs an electrical power generating action. The capacitor also supplies electric power which is stored in the capacitor to the motor-generator via a driver such as a power generation inverter, or supplies the electric power to an electric power load such as an electric motor for driving the working machine.

The capacitor degrades when used over a long period, with repetitive operations of charge and discharge, or by heat generation, etc. Especially, in construction equipment which is operated in a harsh environment, a capacitor mounted in the equipment is prone to quickly degrade. When the degradation of the capacitor has progressed, the hybrid construction equipment lowers its work capability due to the lowering of electric power to be supplied to the electric motor. For this reason, degradation state of the capacitor should be determined in advance, and if it is determined that the degradation state has progressed to the limit, a necessary maintenance such as exchange of the capacitor is required.

As techniques for determining the degradation state of a capacitor, there are the following techniques.
(Conventional Art 1)
As methods for determining the degradation state of a capacitor which are being executed currently, there is a method in which a capacitance of a capacitor is measured using a high-output discharge device which is prepared for servicemen, and it is determined whether the measured capacitance becomes equal to or smaller than a prescribed capacitance. If the measured capacitance value becomes the prescribed capacitance or smaller, maintenance for exchanging capacitors is performed. In this method, firstly, an operation is conducted so that a capacitor mounted on the hybrid construction equipment is dismounted and the capacitor is carried to a place where a high-output discharge device is located to connect the capacitor to the high-output discharge device. Then, charge and discharge are repeated in the capacitor using the high-output discharge device and a voltage value and a current value are detected at that time. Further, capacitance of the capacitor is measured based on the detected voltage value and current value, and it is determined whether the measured capacitance becomes equal to or smaller than the prescribed capacitance.
(Conventional Art 2)
Patent document 1 discloses an invention in which a capacitor is supplied with an electric power from a buck-boost converter unit, a voltage value and a current value of the capacitor during the time are detected, an internal resistance value of the capacitor is calculated based on the detected voltage value and current value, and a degradation state of the capacitor is determined based on the calculated internal resistance value.
Patent document 1: Japanese patent application publication no. 2007-155586

DISCLOSURE OF THE INVENTION

Problems to be Solved by the Invention

According to the above-mentioned conventional art 1, it is necessary to perform the operation of dismounting and carrying the capacitor which is mounted on the equipment, and connecting the capacitor to the high-output discharge device. Therefore, there is a problem that a great deal of work and operation time are required.

Furthermore, a terminal voltage of the capacitor is a high voltage of 300V, and the operation of dismounting and carrying the capacitor which is mounted on the equipment, and connecting the capacitor to the high-output discharge device would involve risks.

In addition, since the high-output discharge device is a special device which is prepared for servicemen, it is impossible for a user or operator to easily know the result of the determination on the degradation state in the driver's seat. Further, there is a problem that much time is taken for the operation of determining the capacitor degradation, during which the construction equipment cannot be worked, which lowers the operation efficiency.

On the other hand, according to the above-mentioned conventional art 2, it is possible to perform the capacitor degradation determination with a capacitor mounted on the construction equipment and by a system which is mounted on the construction equipment. Therefore, the above-described problems arising in the above-mentioned conventional art 1 are solved.

However, this conventional art is based on a system configuration in which an electric power is supplied to the capacitor from the buck-boost converter unit while the engine and the motor-generator are not being driven. Here, an ordinary electric energy flow during the running of hybrid construction equipment is a flow of storing a generated electric power into the capacitor when the engine and the motor-generator are driven and the motor-generator performs a power generating action (this being called "ordinary control"). It should be noted that, during the regeneration, it may take place that an electric energy is supplied from an electric power load such as an electric motor to the capacitor so as to charge the capacitor.

In the conventional art 2, it is necessary to adopt a special system configuration in which the capacitor is charged without driving the engine and the motor-generator, which is different from the ordinary control in which the capacitor is charged by driving the engine and the motor-generator. Because of the special system configuration, it is necessary to adopt a control which is completely different from the ordinary control, which results in that the control is complicated.

Further, since the conventional art 2 adopts a method in which a voltage value and a current value of the capacitor are detected, an internal resistance value of the capacitor is calculated based on the detected voltage value and current value, and a degradation state of the capacitor is determined based on the calculated internal resistance value, an electric current sensor for detecting the current value of the capacitor is an essential component. During a period of the ordinary control, on the other hand, such an electric current sensor is not an essential component. Therefore, for the purpose of decreasing the number of components, reducing the cost, or downsizing, it is ordinary that such a current sensor is not provided in an existing hybrid construction equipment. According to the conventional art 2, however, such a current sensor must be provided only for the purpose of the capacitor degradation determination, which results in an increase in device cost.

The present invention has been made in view of the above circumstances, and its objective of solving problems is that the degradation of an electrical storage device such as a capacitor can be determined by a system which is not an external device but is installed in hybrid construction equipment in a state that the electrical storage device such as a capacitor is mounted. In addition, for the system, an existing device configuration can be utilized as it is, no special system configuration is necessary, and no additional new sensor such as a current sensor is necessitated.

Means for Solving the Problems

The first invention is a method for determining a degradation state of an electrical storage device in hybrid construction equipment provided with an engine, a motor-generator, an electrical storage device, an electric power load, and a working machine driven by the electric power load, comprising:
  a step of checking that at least the working machine has halted;
  a step of shifting into a degradation state determination time control mode when it is checked that the working machine has halted, and increasing in the electrical storage device from a prescribed start charging voltage to a prescribed end charging voltage by driving the motor-generator at a prescribed rotational speed and with a prescribed torque;
  a step of calculating a capacitance of the electrical storage device based on values of the rotational speed and the torque of the motor-generator during the degradation state determination time control mode, values of the start charging voltage and the end charging voltage of the electrical storage device, and a time required for the electrical storage device to reach the end charging voltage from the start charging voltage; and
  a step of determining the degradation state of the electrical storage device by comparing the calculated capacitance of the electrical storage device with a reference capacitance.

The second invention is characterized in that, in the first invention, the capacitance of the electrical storage device is calculated after the capacitance is corrected by temperature of the electrical storage device during the degradation state determination time control mode.

The third invention is characterized in that, in the first invention,
  the charging operation to increase in the electrical storage device from the start charging voltage to the end charging voltage is performed a plurality of times during the degradation state determination time control mode; and
  the degradation state of the electrical storage device is determined by calculating an average capacitance by averaging capacities of the electrical storage device of respective charging operations, and by comparing the average capacitance with the reference capacitance.

The fourth invention is characterized by, in the first invention, further comprising a step of displaying a result of determination of the degradation state of the electrical storage device.

The fifth invention is a device for determining a degradation state of an electrical storage device in hybrid construction equipment provided with
  an engine;
  a motor-generator having a drive shaft that is connected to an output shaft of the engine, and performs an electric power generating action and an electric motor action;
  an electrical storage device that stores electric power when the motor-generator performs the electric power generating action, and supplies the electric power to an electric power load and the motor-generator;
  the electric power load; and
  a working machine driven by the electric power load,
the device for determining a degradation state of an electrical storage device comprising:
  a voltage value detecting unit that detects a charging voltage value in the electrical storage device; and
  a control device that performs a control for determining the degradation state of the electrical storage device,
the control device comprising:
  a state managing unit that checks that at least the working machine has halted, and outputs a command to shift into a degradation state determination time control mode when it is checked that the working machine has halted;
  a charge and discharge control unit that performs a shift into the degradation state determination time control mode when the command is given from the state managing unit, and gives a control command to the engine and the motor-generator so that the motor-generator is driven at a prescribed rotational speed and with a prescribed torque in order to increase in the electrical storage device from a start charging voltage to an end charging voltage while taking in a charging voltage value of the electrical storage device detected by the voltage value detecting unit;
  a capacitance calculating unit that calculates a capacitance of the electrical storage device based on values of the rotational speed and the torque of the motor-generator during the degradation state determination time control mode, values of the start charging voltage and the end charging voltage of the electrical storage device, and a time required for the electrical storage device to reach the end charging voltage from the start charging voltage; and
  a degradation determining unit that determines the degradation state of the electrical storage device by comparing the calculated capacitance of the electrical storage device with a reference capacitance.

The sixth invention is characterized by, in the fifth invention, further comprising a temperature detecting unit that detects temperature of the electrical storage device, wherein
  the capacitance calculating unit calculates the capacitance of the electrical storage device after the capacitance is corrected by the temperature of the electrical storage device during the degradation state determination time control mode.

The seventh invention is characterized in that, in the fifth invention,
  the charge and discharge control unit controls to perform a charging operation to increase in the electrical storage device from the start charging voltage to the end charging voltage a plurality of times, the capacitance calculating unit calculates an average capacitance by averaging capacities of the electrical storage device of respective charging operations, and the degradation determining unit determines the degradation state of the electrical storage device by comparing the average capacitance with the reference capacitance.

The eighth invention is characterized by, in the fifth invention, further comprising a display device, wherein the control unit further comprises a state display unit for displaying a result of determination of the degradation state of the electrical storage device.

The ninth invention is characterized in that, in the fifth invention, the electric power load is an electric motor for driving the working machine.

According to the first invention, as shown in FIG. 3, it is firstly checked that at least the working machine 2 has halted (step 101).

Then, when it is checked that the working machine has halted, a shift into a degradation state determination time control mode is performed, the motor-generator 20 is driven at a prescribed rotational speed and with a prescribed torque, thereby increasing in the electrical storage device 30 from a start charging voltage to an end charging voltage (step 102).

Then, a capacitance of the electrical storage device 30 is calculated based on values of the rotational speed and the torque of the motor-generator 20 during the degradation state determination time control mode, values of the start charging voltage and the end charging voltage of the electrical storage device 30, and a time required for the electrical storage device 30 to reach the end charging voltage from the start charging voltage (step 103).

Then, the degradation state of the electrical storage device 30 is determined by comparing the calculated capacitance of the electrical storage device 30 with a reference capacitance (step 104).

According to the first invention, the degradation of an electrical storage device 30 such as a capacitor can be determined by a system which is not an external device but is installed in hybrid construction equipment 1 in a state that the electrical storage device 30 such as a capacitor is mounted.

Further, the degradation of the electrical storage device 30 can be determined by executing the degradation state determination time control mode in which the electrical storage device 30 is charged by driving the engine 10 and the motor-generator 20 in the same way as the ordinary control in which the electrical storage device 30 is charged by driving the engine 10 and the motor-generator 20. Therefore, the same control can be performed as in the ordinary control in order to make the degradation determination of the electrical storage device 30, which would make it possible to use the existing devices and system as there stand without causing complicated controls.

Furthermore, according to the present invention, since a capacitance of the electrical storage device 30 is calculated based on values of the rotational speed and the torque of the motor-generator 20 during the degradation state determination time control mode, values of the start charging voltage and the end charging voltage of the electrical storage device 30, and a time required for the electrical storage device 30 to reach the end charging voltage from the start charging voltage, the sensors, etc. which are installed in the existing device can be utilized as they are. Therefore, it is unnecessary to add a new sensor such as current sensor as in the conventional art 2.

In the second invention, the capacitance of the electrical storage device 30 is calculated after the capacitance is corrected by the temperature of the electrical storage device during the degradation state determination time control mode as shown in step 406 of FIG. 6.

In the third invention, the charging operation to increase in the electrical storage device from the start charging voltage to the end charging voltage is performed a plurality of times during the degradation state determination time control mode as shown in steps 301 through 306 of FIG. 5, the average capacitance is calculated by averaging capacities of the electrical storage device of respective charging operations as shown in step 405 of FIG. 6, and the degradation state of the electrical storage device 30 is determined by comparing the average capacitance with the reference capacitance as shown in step 502 of FIG. 7.

In the fourth invention, a step of displaying a result of determination of the degradation state of the electrical storage device 30 is further performed as shown in step 105 of FIG. 3.

The fifth invention is a device invention which corresponds to a method invention of the first invention, and, as shown in FIG. 1, the hybrid construction equipment 1 comprises an engine 10; a motor-generator 20 having a driving shaft that is connected to an output shaft of the engine 10, and performs an electric power generating action and an electric motor action; an electrical storage device 30 that stores electric power when the motor-generator 20 performs the electric power generating action, and supplies the electric power to an electric power load 40 and the motor-generator 20; the electric power load; a working machine 2 which is driven by the electric power load 40; a voltage value detecting unit 50 that detects a charging voltage value of the electrical storage device; and a control device 60 that performs a control for determining a degradation state of the electrical storage device 30.

As shown in FIG. 2, the control device 60 comprises a state managing unit 61, a charge and discharge control unit 62, a capacitance calculating unit 63, and a degradation determining unit 64.

The state managing unit 61 checks that at least the working machine 2 has halted, and outputs a command to shift into a degradation state determination time control mode when it is checked that the working machine 2 has halted.

The charge and discharge control unit 62 that performs a shift into the degradation state determination time control mode when the command is given from the state managing unit 61, and gives a control command to the engine 10 and the motor-generator 20 so that the motor-generator 20 is driven at a prescribed rotational speed and with a prescribed torque in order to increase in the electrical storage device 30 from a start charging voltage to an end charging voltage while taking in a charging voltage value of the electrical storage device 30 detected by the voltage value detecting unit 50.

The capacitance calculating unit 63 calculates a capacitance of the electrical storage device 30 based on values of the rotational speed and the torque of the motor-generator 20 during the degradation state determination time control mode, values of the start charging voltage and the end charging voltage of the electrical storage device 30, and a time required for the electrical storage device 30 to reach the end charging voltage from the start charging voltage.

The degradation determining unit 64 determines the degradation state of the electrical storage device 30 by comparing the calculated capacitance of the electrical storage device 30 with a reference capacitance.

In the sixth invention, a temperature detecting unit 31 that detects temperature of the electrical storage device 30 is further provided, and the capacitance calculating unit 63 calculates the capacitance of the electrical storage device after the capacitance is corrected by the temperature of the electrical storage device 30 during the degradation state determination time control mode.

In the seventh invention, the charge and discharge control unit 62 performs a charging operation to increase in the electrical storage device 30 from the start charging voltage to the end charging voltage a plurality of times, the capacitance calculating unit 63 calculates an average capacitance by averaging capacities of the electrical storage device 30 of respective charging operations, and the degradation determining unit 64 determines the degradation state of the electrical storage device 30 by comparing the average capacitance with the reference capacitance.

In the eighth invention, as shown in FIG. 1, a display device 71 is further provided, and a state display unit 65 of the control unit 60 displays a result of determination of the degradation state of the electrical storage device 30 on the display device 71.

In the ninth invention, as shown in FIG. 1, the device is constructed with an electric motor 40 for driving the working machine 2 as the electric power load.

BEST MODE FOR CARRYING OUT THE INVENTION

Exemplary embodiment of a method and a device for determining degradation state of an electric storage device in hybrid construction equipment will be described below with reference to the accompanying drawings. It should be noted that the following description will be made using a capacitor as the electrical storage device and an electric motor for driving the working machine 2 as the electric power load.

FIG. 1 illustrates an overall device configuration according to an Embodiment.

As shown in FIG. 1, a hybrid construction equipment 1 of the embodiment comprises an engine 10; a motor-generator 20 having a driving shaft that is connected to an output shaft of the engine 10, and performs an electric power generating action and an electric motor action; a capacitor 30 serving as the electrical storage device that stores electric power when the motor-generator 20 performs the electric power generating action, and supplies the electric power to an electric motor 40 serving as the electric power load and the motor-generator 20; the electric motor 40 serving as the electric power load; and a working machine 2 which is driven by the electric motor 40.

A voltage sensor 50 serving as the voltage value detecting unit detects a charging voltage value of the capacitor 30.

A temperature sensor 31 serving as the temperature detecting unit detects the temperature of the capacitor 30.

A driver's seat is provided with a monitor 70. The monitor 70 includes a display device 71.

A control device 60 is provided to perform a degradation state determination time control for determining the degradation state of the capacitor 30. As will be described later in connection with FIG. 2, the control device 60 comprises a state managing unit 61, a charge and discharge control unit 62, a capacitance calculating unit 63, a degradation determining unit 64, and a state display unit 65. The charge and discharge control unit 62, the capacitance calculating unit 63, and the degradation determining unit 64 are provided in a controller 69, and the state managing unit 61 and the state display unit 65 are provided in the monitor 70. Also, the controller 69 is provided with an ordinary control unit 66, and performs an ordinary control. Detection signals from the voltage sensor 50 and the temperature sensor 31 are input into the control device 60.

An integrated inverter 80 comprises the controller 69, AC signal lines 81a, 81b, 81c, 81d, 81e and 81f, a driver 82, a DC signal lines 83a and 83b, an inverter 84, AC signal lines 85a, 85b and 85c, DC signal lines 86a and 86b, a converter 87, DC signal lines 88a and 88b, and a contactor 89.

As the motor-generator 20, an SR (Switched Reluctance) motor, for example, is used.

The driver 82 is constituted by an inverter that drives the motor-generator 20. The motor-generator 20 is electrically connected to the driver 82 via the AC signal lines 81a, 81b, 81c, 81d, 81e, and 81f.

The driver 82 is electrically connected to the inverter 84 via the DC signal lines 83a and 83b. The inverter 84 is electrically connected to the electric motor 40 via the AC signal lines 85a, 85b and 85c. As the electric motor 40, a PM (Permanent Magnetic) motor, for example, is used.

The output shaft of the electric motor 40 is connected to the driving shaft of the working machine 2. If, for example, the construction equipment is a hydraulic shovel, the electric motor 40 is a rotating motor for rotating the upper rotating structure, and the working machine 2 is a swing machinery that decreases the rotational speed of the rotating motor to rotate the upper rotating structure. The working machine 2 is operated by an operating lever 2a. The fact that the operating lever 2a becomes in a neutral position is detected by a neutral position sensor 2b and is input to the control device 60.

The capacitor 30 is electrically connected to the converter 87 via the DC signal lines 88a and 88b. The DC signal line 88a is provided with a contactor 89. The contactor 89 is closed when an engine key switch is turned on so that the DC signal line 88a is in a conduction state.

The converter 87 is electrically connected to the DC signal lines 83a and 83b via the DC signal lines 86a and 86b. The converter 87 is provided to increase the charging voltage of the capacitor 30 and apply the increased voltage to the DC signal lines 83a and 83b. The converter 87 is constituted, for example, by an AC link bidirectional DC-DC converter. The converter 87 is controlled by the controller 69.

The rotational speed of the engine 10, that is, the rotational speed of the motor-generator 20, is controlled by the controller 69. The controller 69 gives the engine 10 a rotational speed command for causing the engine 10 to rotate at a prescribed rotational speed.

Torque of the motor-generator 20 is controlled by the controller 69. The controller 69 gives the driver 82 a torque command for causing the driver 82 to drive the motor-generator 20 with a prescribed torque.

The motor-generator 20 is torque-controlled by the controller 69. When a torque command of negative (−) polarity is given to the driver 82, the driver 82 performs a control so that the motor-generator 20 serves as a power generator. Specifically, a part of the output torque generated by the engine 10 is transmitted to the driving shaft of the motor-generator 20 to absorb the torque of the engine 10, whereby power is generated. And, an AC electric power generated at the motor-generator 20 is converted into a DC electric power by the driver 82 serving as a power generating inverter, and is supplied to the DC signal lines 83a and 83b.

Also, when a torque command of positive (+) polarity is given to the driver 82, the driver 82 performs a control so that the motor-generator 20 serves as a motor. Specifically, via the DC signal lines 88a and 88b, the converter 87, the DC signal lines 86a and 86b, and DC signal lines 83a and 83b, a DC electric power stored in the capacitor 30 is converted into an AC electric power by the driver 82 serving as a power generating inverter, and is supplied to the motor-generator 20, thereby to rotate the driving shaft of the motor-generator 20. This causes the generation of torque at the motor-generator 20. This torque is transmitted from the driving shaft of the motor-generator 20 to the output shaft of the engine, and is added to the output torque of the engine 10. The driver 82 converts the electric power into an electric power of desired voltage, frequency and number of phase suitable for the motor-generator 20, and supplies it to the motor-generator 20.

The power generating amount (absorbed torque amount) and the electric motoring amount (assist amount; generated torque amount) of the motor-generator 20 vary in accordance with the content of the above-mentioned torque command.

The inverter 84 converts an electric power, that is, a generated electric power when the motor-generator 20 performed power generating action or an electric power stored in the capacitor 30 into an electric power of desired voltage, frequency and number of phase suitable for the electric motor 40, and supplies it to the electric motor 40, via the DC signal lines 83a and 83b, and the AC signal lines 85a, 85b and 85c. Incidentally, when the working machine 2 is being decelerated, braked and so on, kinetic energy is converted into electric energy, which in turn is supplied to the DC signal lines 83a and 83b via the AC signal lines 85a, 85b and 85c, and the inverter 84. The regenerated electric power supplied to the DC signal lines 83a and 83b is either stored in the capacitor 30, or supplied to the motor-generator 20 via the driver 82 as an electric power for the motor.

Thus, when the motor-generator 20 performs the power generating action, the capacitor 30 stores an electric power generated by the motor-generator 20, or an electric power regenerated via the working machine 2. In addition, the capacitor 30 supplies an electric power stored in the capacitor 30 to the motor-generator 20, or supplies this electric power to the electric motor 40. The foregoing is the content of the ordinary control.

FIG. 2 is a block diagram illustrating a configuration of the control device 60 according to the Embodiment.

The state managing unit 61 checks that at least the working machine 2 has halted, in other words, the operating lever 2a is in a neutral position, and outputs to the charge and discharge control unit 62 a start command for making a shift into the degradation state determination time control mode when it is checked that the working machine 2 has halted. Also, the state managing unit 61 outputs to the charge and discharge control unit 62 an end command for terminating the degradation state determination time control mode. In addition, the state managing unit 61, upon receiving a determination result of the degradation state of the capacitor 30, transmits to the state display unit 65 a determination result display command for displaying the determination result.

The charge and discharge control unit 62 performs a shift into the degradation state determination time control mode when the start command is given from the state managing unit 61, and gives a rotational speed command to the engine 10 and a torque command to the driver 82 of the motor-generator 20 so that the motor-generator 20 is driven at a prescribed rotational speed and with a prescribed torque in order to increase in the capacitor 30 from a start charging voltage to an end charging voltage. In addition, the charge and discharge control unit 62, during a period in which the degradation state determination time control mode is being executed, takes in a charging voltage value of the capacitor 30 detected by the voltage sensor 50, and a temperature of the capacitor 30 detected by the temperature sensor 31. In addition, the charge and discharge control unit 62 causes a charging action for increasing in the capacitor 30 from the prescribed start charging voltage to the prescribed end charging voltage to be performed plural times. The charge and discharge control unit 62 terminates the degradation state determination time control mode when the end command is given from the state managing unit 61. The charge and discharge control unit 62 outputs to the capacitance calculating unit 63 values of the rotational speed and the torque of the motor-generator 20 during the degradation state determination time control mode, values of the start charging voltage and the end charging voltage of the capacitor 30, and a time required for the capacitor device 30 to reach the end charging voltage from the start charging voltage. In addition, the charge and discharge control unit 62, in order to correct the capacitance of the capacitor 30 in accordance with the temperature, outputs the temperature of the capacitor 30 during the degradation state determination time control mode to the capacitance calculating unit 63.

The capacitance calculating unit 63 calculates the capacitance of the capacitor 30 based on the data input from the charge and discharge control unit 62, that is, values of the rotational speed and the torque of the motor-generator 20 during the degradation state determination time control mode, values of the start charging voltage and the end charging voltage of the capacitor 30, and a time required for the capacitor device 30 to reach the end charging voltage from the start charging voltage. The capacitance calculating unit 63 calculates an average capacitance by averaging the capacities of the electrical storage device 30 of respective charging operations. The capacitance calculating unit 63 calculates the capacitance of the capacitor 30 after the capacitance is corrected by the temperature of the electrical storage device during the degradation state determination time control mode. The capacitance calculating unit 63 outputs the calculated capacitance of the capacitor 30 to the degradation determining unit 64.

The degradation determining unit 64 determines the degradation state of the capacitor 30 by comparing the calculated capacitance input from the capacitance Calculating unit 63 with the reference capacitance. The degradation determining unit 64 determines the degradation state of the capacitor 30 by comparing the calculated capacitance with the reference capacitance. The degradation determining unit 64 outputs the determination result of the degradation state of the capacitor 30 to the state managing unit 61.

The state managing unit 61, upon receiving the determination result display command from the state managing unit 61, displays the determination result of the degradation state of the capacitor 30 on the display device 71 of the monitor 70.

Next, procedure of the degradation state determination time control process will be described with reference to the flowchart illustrated in FIGS. 3 through 7.

FIG. 3 illustrates an entire flow of the degradation state determination time control according to the Embodiment.

Specifically, it is firstly checked that at least the working machine 2 has halted, that is, the operating lever 2a is in a neutral position (step 101).

Next, when it is checked that the working machine 2 has halted, a shift into the degradation state determination time control mode is performed, the motor-generator 20 is driven at the prescribed rotational speed and with the prescribed torque, thereby increasing in the capacitor 30 from the prescribed start charging voltage to the prescribed end charging voltage. During the degradation state determination time control mode, a charging action of increasing in the capacitor 30 from the prescribed start charging voltage to the prescribed end charging voltage is repeated plural times (step 102).

Next, the capacitance of the capacitor 30 is calculated based on the data obtained during the degradation state determination time control mode, that is, values of the rotational speed and the torque of the motor-generator 20, values of the start charging voltage and the end charging voltage of the capacitor 30, and a time required for the capacitor device 30 to reach the end charging voltage from the start charging voltage. In addition an average capacitance is calculated by averaging the capacities of the capacitor 30 of respective charging operations. The capacitance of the capacitor 30 is calculated after the capacitance is corrected by the temperature of the capacitor during the degradation state determination time control mode (step 103).

Next, the degradation state of the capacitor 30 is determined by comparing the calculated capacitance with the reference capacitance. The degradation state of the capacitor 30 is determined by comparing the average capacitance that is calculated by averaging the capacities of respective charging operations with the reference capacitance (step 104).

Next, the determination result of the degradation state of the capacitor 30 is displayed (step 105).

Processes performed in the state managing unit 61, the charge and discharge control unit 62, the capacitance calculating unit 63, the degradation determining unit 64, and the state display unit 65 will be specifically described one by one with reference to FIGS. 4 through 7.

FIG. 4 illustrates a procedure to be taken in the process of the state managing unit 61.

A driver seat of the hybrid construction equipment 1 is provided with a switch that instructs the degradation state determination time control. When the switch is operated, it is determined whether or not the following conditions are fulfilled.

The state managing unit 61 firstly checks that the working machine 2 has halted, in other words, the operating lever 2a is in a neutral position based on a detection result of the neutral position sensor 2b.

In addition, it is checked that there is no error in each component. Error codes are checked for each of electronic equipment provided inside the hybrid construction equipment 1, such as the control device 60, and it is checked that no error has occurred.

When the foregoing is checked (YES in the determination of step 201), a start command for instructing the start of measurement on the capacitance of the capacitor 30 is output (step 202).

Next, it is checked whether or not determination result on the degradation state of the capacitor 30 is received from the degradation determining unit 64 (step 203).

When the determination result on the degradation state of the capacitor 30 is received (YES in the determination of step 203), the state managing unit 61 outputs to the state display unit 65 a determination result display command for instructing to display the determination result on the degradation state of the capacitor 30 on the display device 71 of the monitor 70 (step 204).

FIG. 5 illustrates a procedure to be taken in the process of the charging and discharging control unit 62.

When the start command is given from the state managing unit 61, the charge and discharge control unit 62 starts the process in FIG. 5, and causes a shift to be made into the degradation state determination time control mode. During the degradation state determination time control mode, a rotational speed command is given to the engine 10 and a torque command is given to the driver 82 of the motor-generator 20 so that the motor-generator 20 is driven at a prescribed rotational speed Ne and with a prescribed torque Tr, thereby increasing in the capacitor from a prescribed start charging voltage V0 to a prescribed end charging voltage V1 (steps 301-304).

Specifically, the torque command is given to the driver 82 of the motor-generator 20 and the constant-voltage-control is performed for the motor-generator 20 so that the capacitor 30 has a constant voltage V0 of, for example, 220 Volt. When the capacitor 30 has the constant voltage V0 (=220V) (YES in the determination of step 301), charging to the capacitor 30 is started with this voltage V0 (=220V) being as the start charging voltage. At the start of charging, timekeeping by a timer that measures a charging time $\Delta T$ is started (step 302).

Thereafter, the torque command is given to the driver 82 of the motor-generator 20 to torque-control the motor-generator 20 so that the capacitor 30 is charged up to a voltage V1 of, for example, 280 Volt. When the capacitor 30 is charged up to the voltage V1 (=280V) (YES in the determination of step 303), charging to the capacitor 30 is terminated with this voltage V1 (=280V) being as the end charging voltage. At the end of charging, the timekeeping by the timer that measures the charging time $\Delta T$ is halted (step 304). The determination concerning whether an actual charging voltage value reaches the start charging voltage V0 or the end charging voltage V1 is made based on the detection result of the voltage sensor 50.

The charge and discharge control unit 62 takes in the temperature tc of the capacitor 30 detected by the temperature sensor 31 during the degradation state determination time control mode, and, in addition, measures the charging time $\Delta T$ required for the capacitor 30 to reach the end charging voltage V1 from the start charging voltage V0 based on the result of the above-mentioned timekeeping by the timer.

For the calculation of the capacitance C of the capacitor 30, the charge and discharge control unit 62 outputs to the capacitance calculating unit 63 the rotational speed value Ne and the torque value Tr of the motor-generator 20 during the degradation state determination time control mode, the start charging voltage V0 and the end charging voltage V1 of the capacitor 30, and the charging time $\Delta T$ required for the capacitor 30 to reach the end charging Next, in the charge and discharge control unit 62, it is determined whether or not the charging action to increase in the capacitor 30 from the start charging voltage V0 to the end charging voltage V1 has been performed a prescribed plural times, for example, 10 times, in other words, it is determined whether or not the calculation of the capacitance C of the capacitor 30 has been performed the prescribed times (10 times). Here, the reason why the calculation of the capacitance C of the capacitor 30 should be performed the prescribed times (10 times) is for the purpose of suppressing a variation in the calculation result of the capacitance C.

If the charging action to increase in the capacitor 30 from the start charging voltage V0 to the end charging voltage V1 has not been performed a prescribed plural times (10 times) (NO in the determination of step 306), the above-mentioned process in steps 301 through 305 is performed repeatedly. If the charging action to increase in the capacitor 30 from the start charging voltage V0 to the end charging voltage V1 has been performed a prescribed plural times (10 times) (YES in the determination of step 306), a process for measuring the capacitance C of the capacitor 30, that is, the above-mentioned degradation state determination time control mode, is completed. When the end command is given from the state managing unit 61, the charge and discharge control unit 62 terminates the degradation state determination time control mode (step 307).

FIG. 6 illustrates a procedure to be taken in the process of the capacitance calculating unit 63.

The capacitance calculating unit 63 receives data input from the charge and discharge control unit 62, that is, the rotational speed value Ne and the torque value Tr of the motor-generator 20 during the degradation state determination time control mode, the start charging voltage V0 and the end charging voltage V1 of the capacitor 30, and the charging time ΔT required for the capacitor 30 to reach the end charging voltage V1 from the start charging voltage V0. In addition, the capacitance calculating unit 63 receives the temperature tc of the capacitor 30 during the degradation state determination time control mode (step 401).

The capacitance of the capacitor 30 is calculated based on the rotational speed value Ne and the torque value Tr of the motor-generator 20 during the degradation state determination time control mode, the start charging voltage V0 and the end charging voltage V1 of the capacitor 30, and the charging time ΔT required for the capacitor 30 to reach the end charging voltage V1 from the start charging voltage V0 (steps 402 and 403).

Specifically, an energy flow at the time when a generated energy ΔW of the motor-generator 20 is supplied to the capacitor 30 as a charging energy ΔJ is represented by an arrow A in FIG. 9.

The generated energy ΔW can be obtained by using the rotational speed value Ne and the torque value Tr of the motor-generator 20 during the degradation state determination time control mode.

Therefore, supposing that an energy efficiency α in supplying an energy from the power generating motor 20 constituted as the SR motor to the integrated inverter 80 is a constant of 0.95, and an inverter efficiency β in the integrated inverter 80 is a constant of 556.6[J/sec], the charging energy ΔJ of the capacitor 30 is expressed, by using the generated energy ΔW of the motor-generator 20, the energy efficiency α (constant of 0.95), the inverter efficiency β (constant of 556.6[J/sec]), and the charging time ΔT, as the following formula (1).

$$\Delta J = \Delta W \times \alpha - (\beta \times \Delta T) \quad (1)$$

Meanwhile, the charging energy ΔJ of the capacitor 30 is expressed, by using the capacitance C of the capacitor 30, the start charging voltage V0 and the end charging voltage V1 of the capacitor 30, as the following formula (2).

$$\Delta J = (1/2) \cdot C \cdot (V1^2 - V0^2) \quad (2)$$

As described above, the charging energy ΔJ of the capacitor 30 is calculated (step 402).

Next, the capacitance C of the capacitor 30 is calculated from the above charging energy ΔJ calculating formulae (1) and (2) (step 403).

Next, in the capacitance calculating unit 63, it is checked whether calculation of the capacitance C of the capacitor 30 based on the formulae (1) and (2) has been performed prescribed times (10 times) (step 404).

If the calculation of the capacitance C of the capacitor 30 based on the formulae (1) and (2) has not been performed prescribed times (10 times) (NO in the determination of step 404), the above-described capacitance calculation process in steps 401 through 403 is performed repeatedly. If the calculation of the capacitance C of the capacitor 30 based on the formulae (1) and (2) has been performed prescribed times (10 times) (YES in the determination of step 404), the process for the calculation of the capacitance C of the capacitor 30 based on the formulae (1) and (2) is completed, and the operation proceeds to the next step 405.

Next, the capacitance calculating unit 63 performs an averaging operation for the capacitance C of the capacitor 30 that has been calculated plural times (ten times) to obtain an average capacitance C (step 405).

Next, the capacitance calculating unit 63 corrects the average capacitance C of the capacitor 30 by the temperature tc of the capacitor 30 during the degradation state determination time control mode, and calculates the corrected capacitance C. This correction is performed by multiplying the average capacitance C of the capacitor 30 by a correction coefficient K which varies in accordance with the temperature tc of the capacitor 30, for example, shown in the following table.

| Capacitor temperature tc | → | Correction coefficient K |
|---|---|---|
| 0° C. | → | 1.03 |
| 25° C. | → | 0 |
| 40° C. | → | 0.99 |
| 60° C. | → | 0.98 |
| | | (step 406) |

Next, the capacitance calculating unit 63 completes the capacitance calculation process, and outputs the ultimately obtained calculated capacitance value (average capacitance) C of the capacitor 30 to the degradation determining unit 64 (step 407).

FIG. 7 illustrates a procedure to be taken in the process of the degradation determining unit 64.

The degradation determining unit 64, upon receiving the calculated capacitance value (average capacitance) C of the capacitor 30 from the capacitance calculating unit 63 (step 501), determines the degradation state of the capacitor 30 by comparing the received calculated capacitance value (average capacitance) C with an initial capacitance C0 serving as a reference.

For example, supposing that the initial capacitance C0 of the capacitor 30 is 100%, if the calculated capacitance value C of the capacitor 30 is 75% or greater of the initial capacitance C0 (YES in the determination of step 502), it is determined that the degradation state of the capacitor 30 is OK ("not degraded"). The degradation determining unit 64 outputs the determination result ("OK") of the degradation state of the capacitor 30 to the state managing unit 61 (step 503). On the other hand, if the calculated capacitance value C of the capacitor 30 is less than 75% of the initial capacitance C0 (NO in the determination of step 502), it is determined that the degradation state of the capacitor 30 is NG ("degraded"). The degradation determining unit 64 outputs the determination result ("NG") of the degradation state of the capacitor 30 to the state managing unit 61 (step 504).

It should be noted that although the determination of the degradation state of the capacitor 30 is expressed as having two levels of "OK" and "NG" in the Embodiment, the determination of the degradation state may be made with the degree of the degradation being expressed as having more than two levels.

FIG. 8 illustrates a procedure to be taken in the process of the state display unit 65.

The state display unit 65, upon receiving the determination result display command from the state managing unit 61 (step 601), determines whether a determination result is "OK" or not (step 602).

If the determination result is "OK" (YES in the determination of step 602), the display device 71 of the monitor 70 displays a content showing the fact that the degradation state of the capacitor 30 is currently "OK" (not degraded) (step 603). Also, if the determination result is "NG" (NO in the determination of step 602), the display device 71 of the monitor 70 displays a content showing the fact that the degradation state of the capacitor 30 is currently "NG" (degraded) (step 604).

Incidentally, although the determination result on the degradation state of the capacitor 30 is notified to a user, operator or serviceperson by displaying the same in the above Embodiment, other measures may be employed such as a sounding of a buzzer, etc., if the degradation state of the capacitor 30 can be recognized by the user, operator or serviceperson on the vehicle.

From the foregoing, according to the Embodiment, the degradation of the capacitor 30 can be determined by a system which is not an external device but is installed in the hybrid construction equipment 1 in a state that the capacitor 30 is mounted.

Further, the degradation of the capacitor 30 can be determined by executing the degradation state determination time control mode in which the capacitor 30 is charged by driving the engine 10 and the motor-generator 20 in the same way as the ordinary control in which the capacitor 30 is charged by driving the engine 10 and the motor-generator 20. Therefore, the same control can be performed as in the ordinary control in order to make the degradation determination of the capacitor 30, which would make it possible to use the existing devices and system as there stand without causing complicated controls.

Furthermore, according to the Embodiment, since a capacitance of the capacitor 30 is calculated based on values of the rotational speed Ne and the torque Tr of the motor-generator 20 during the degradation state determination time control mode, the start charging voltage value V0 and the end charging voltage value V1 of the capacitor 30, and a time required for the capacitor 30 to reach the end charging voltage value V1 from the start charging voltage value V0, the sensors, etc. which are installed in the existing device can be utilized as they are. Therefore, it is unnecessary to add a new sensor such as a current sensor as in the conventional art 2, thereby to hold down the cost of the device.

Figure 1:
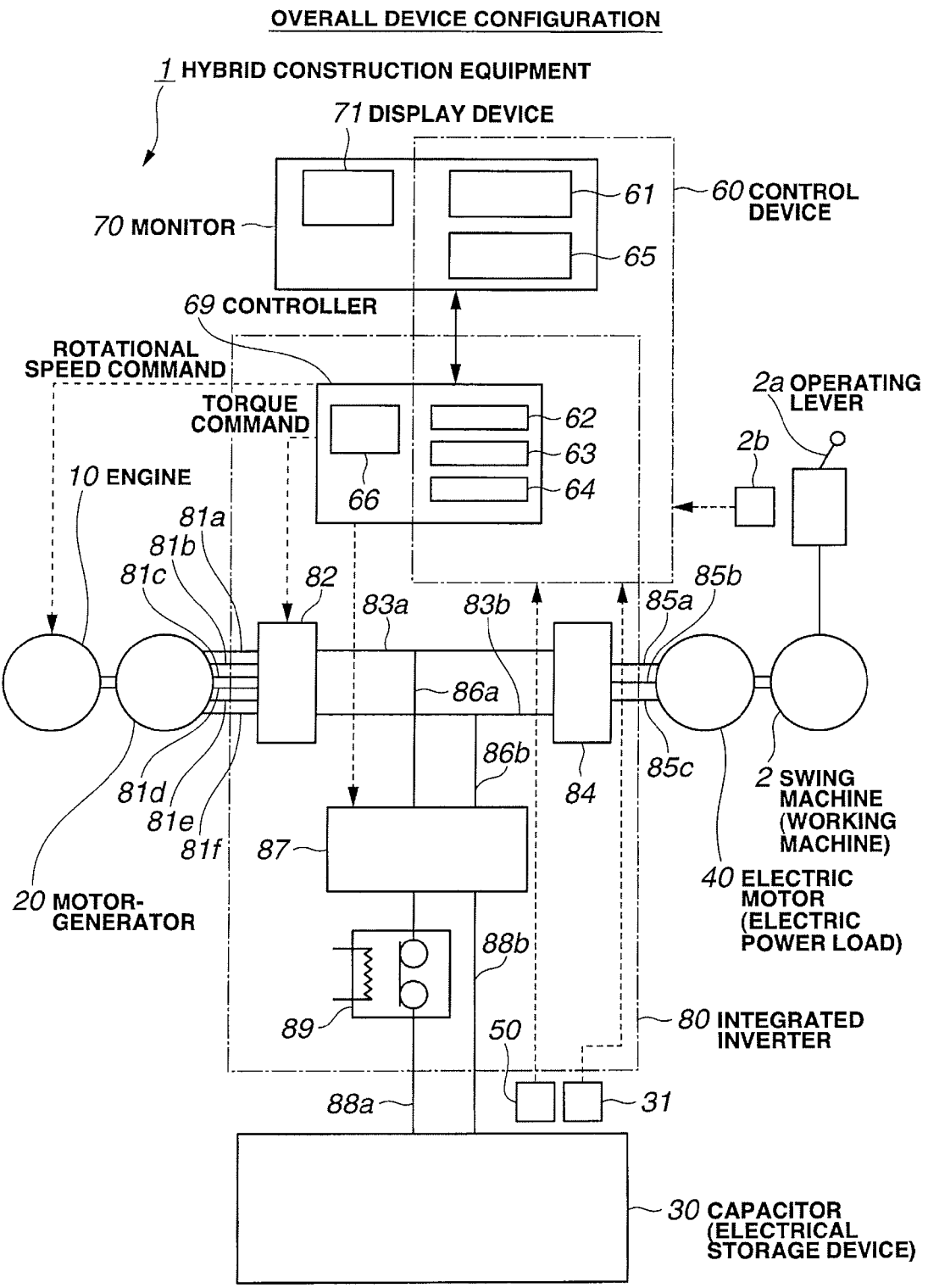
FIG. 1 illustrates an overall device configuration according to an Embodiment.
Figure 2:
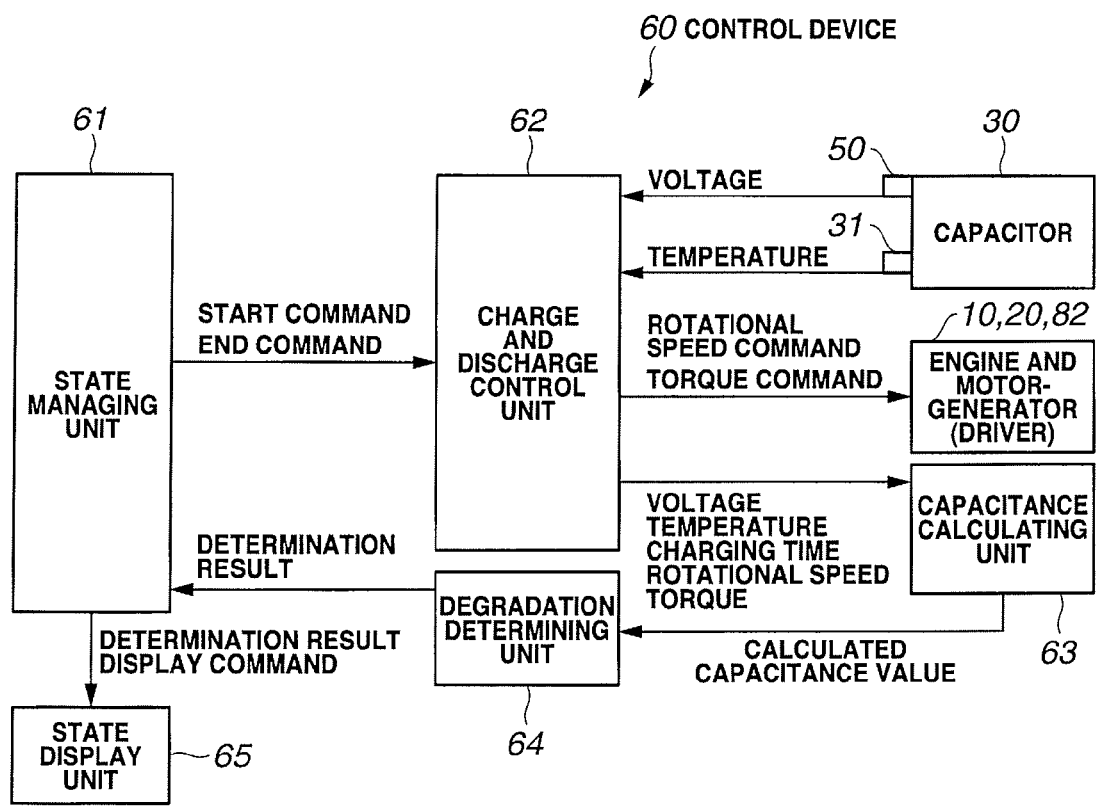
FIG. 2 is a block diagram illustrating a configuration of the control device according to the Embodiment.
Figure 3:
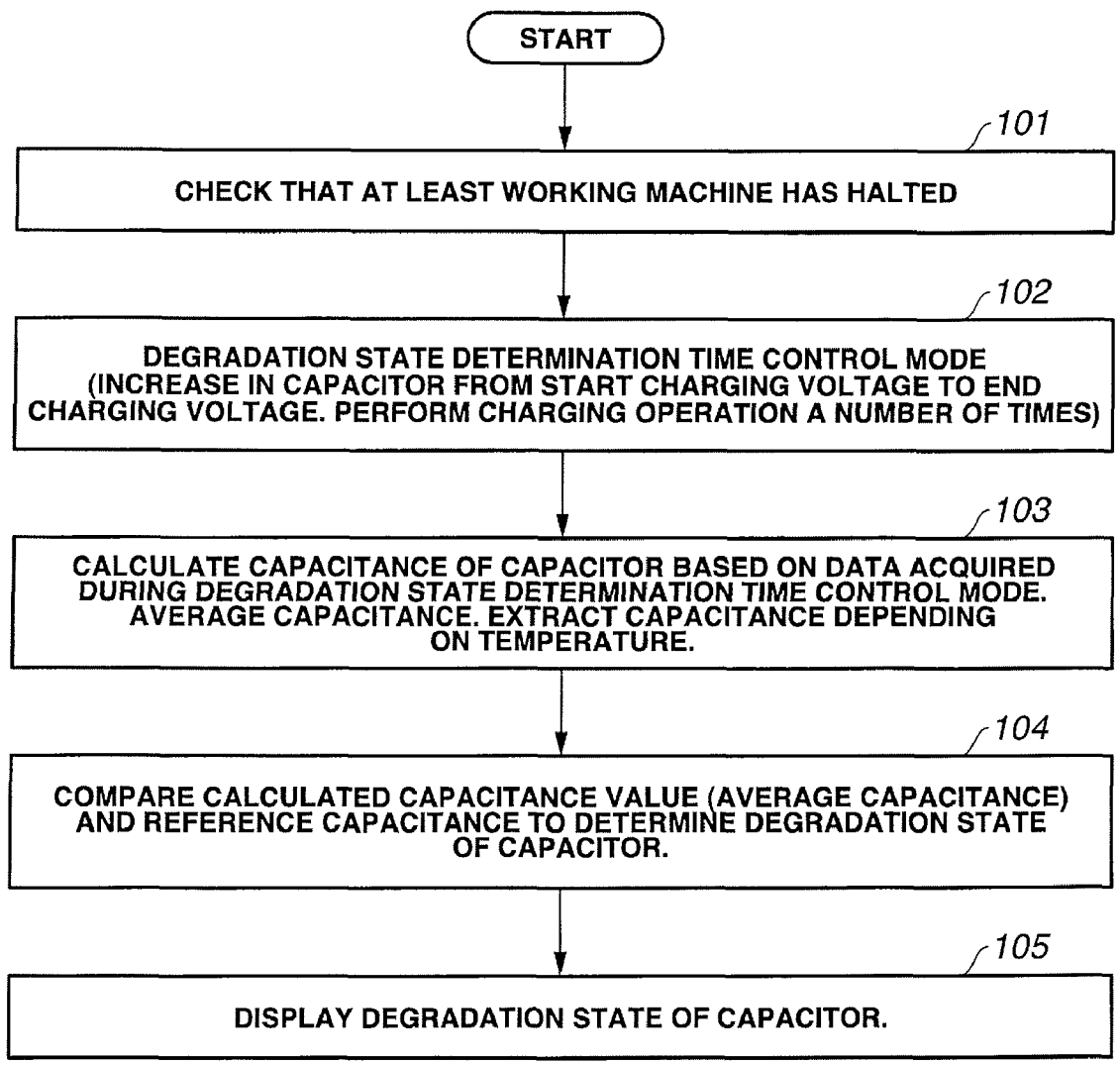
FIG. 3 illustrates an entire flow of the degradation state determination time control according to the Embodiment.
Figure 4:
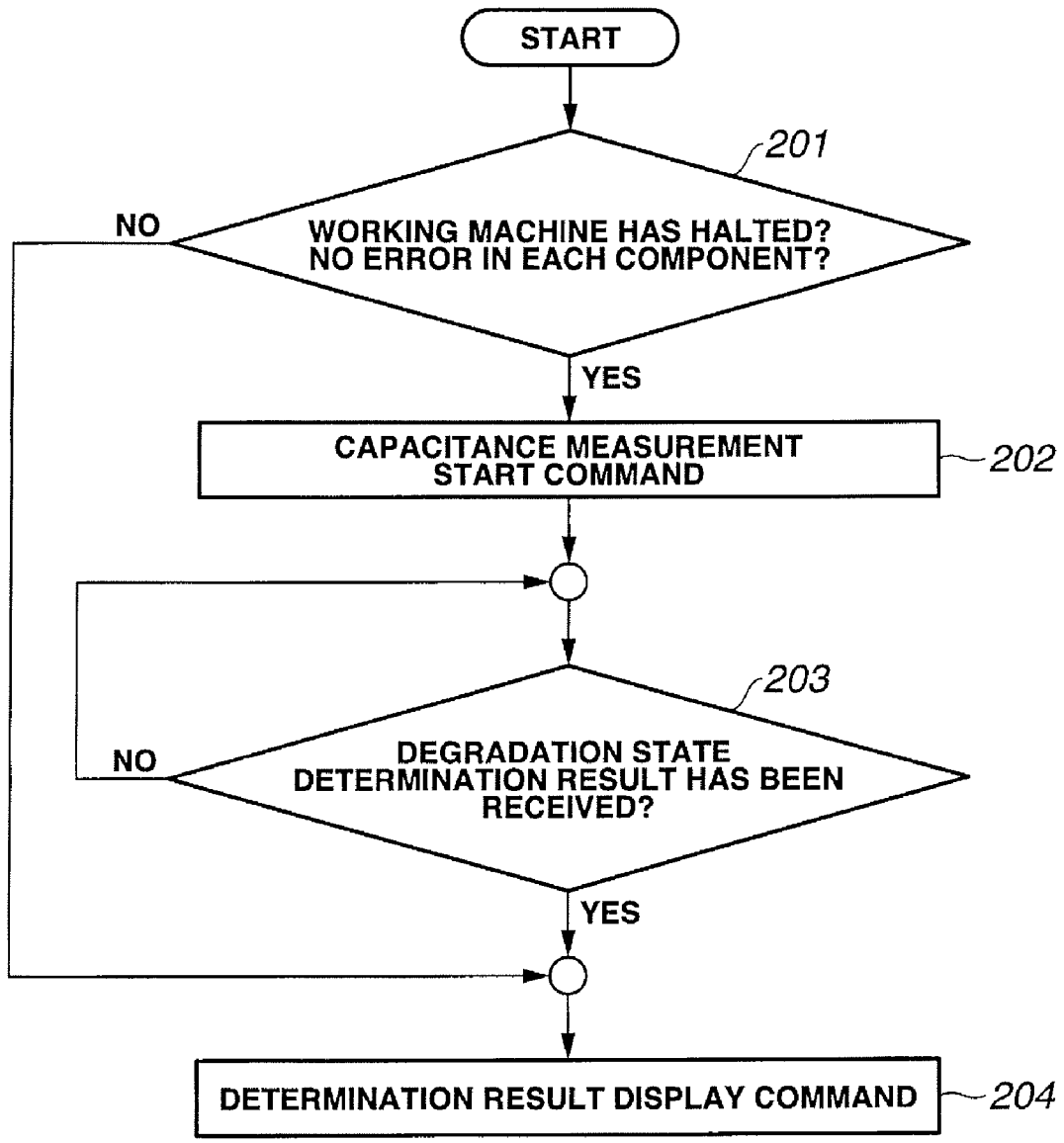
FIG. 4 is a flowchart illustrating a procedure to be taken in the process of the state managing unit.
Figure 5:
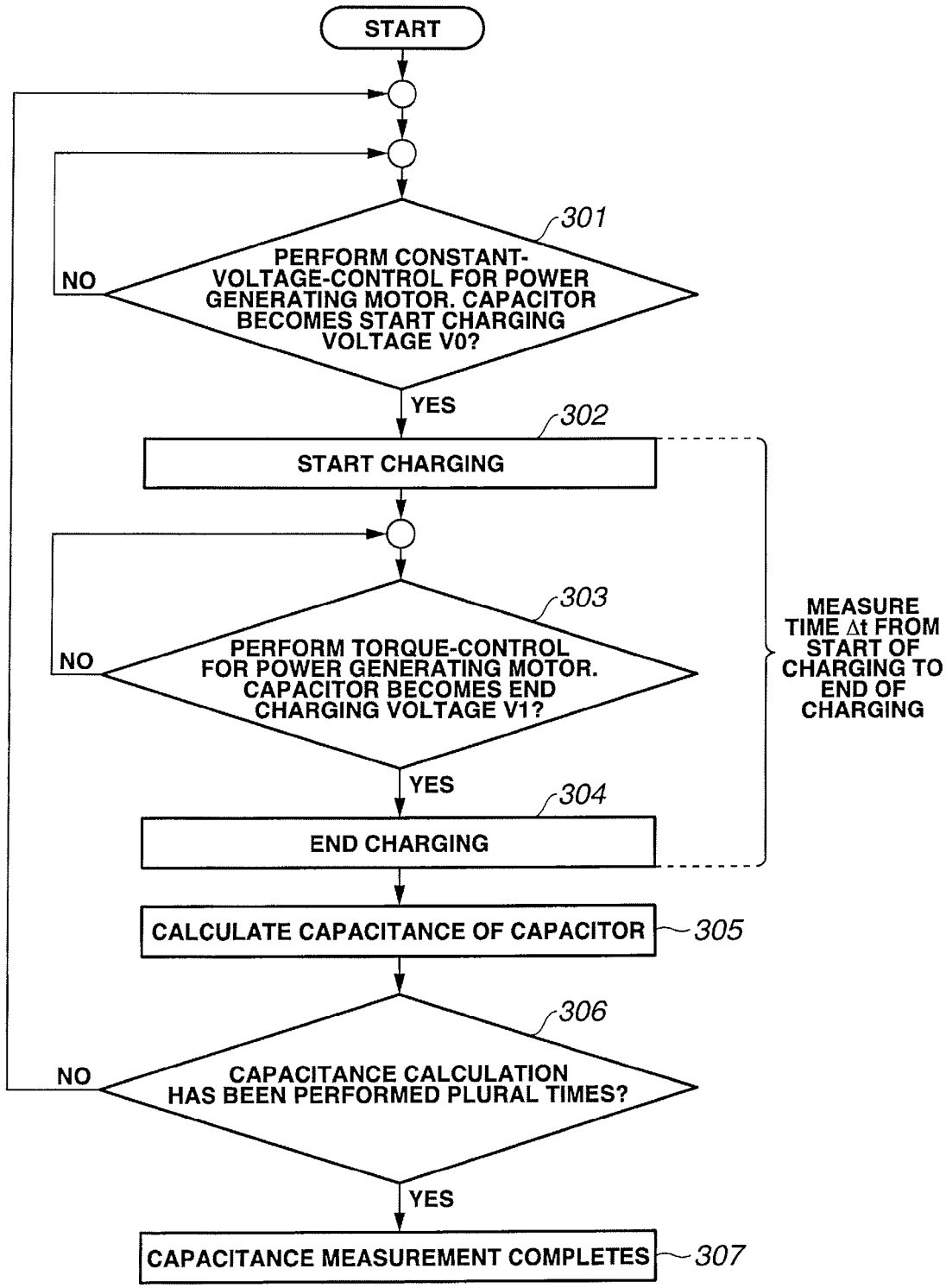
FIG. 5 is a flowchart illustrating a procedure to be taken in the process of the charging and discharging control unit.
Figure 6:
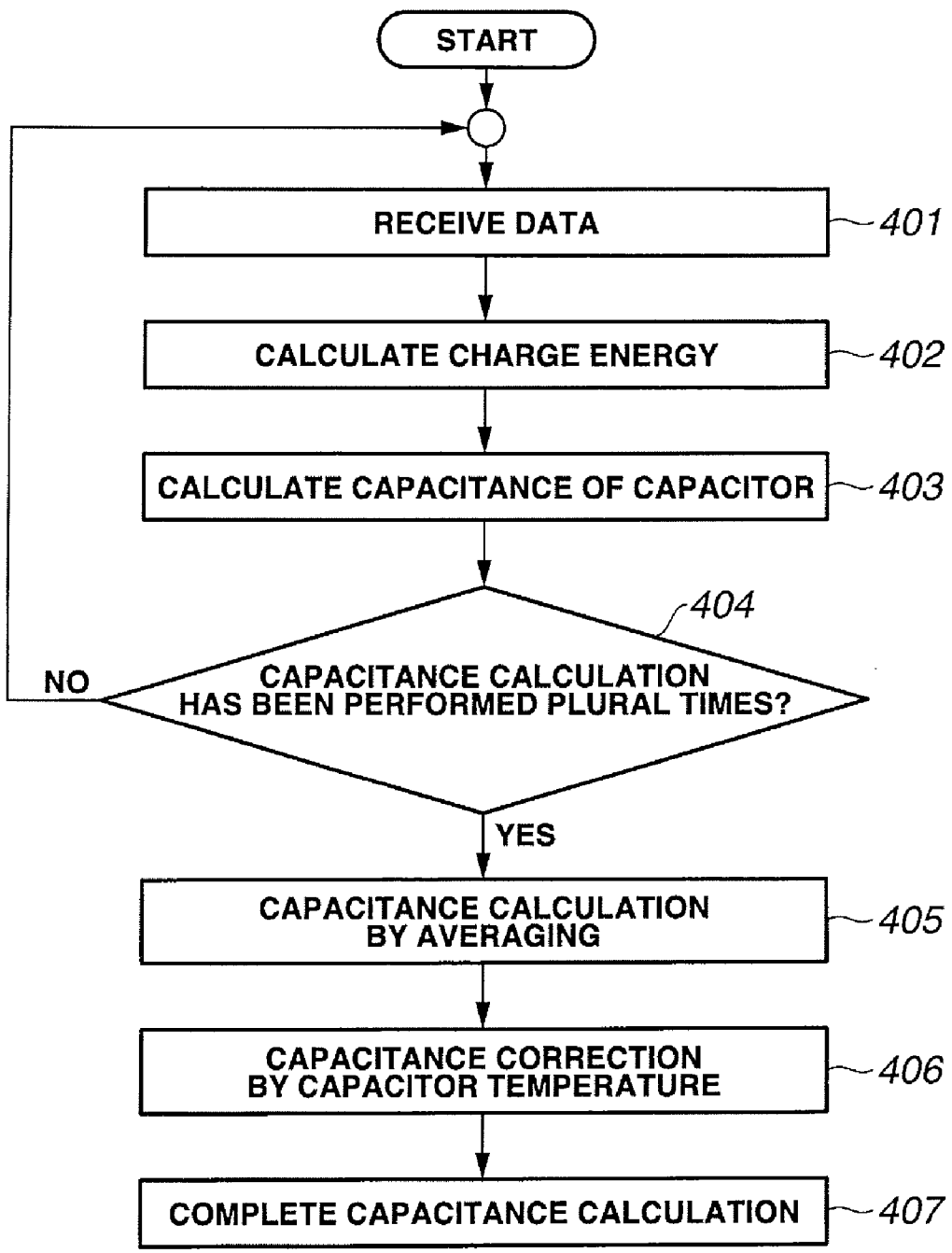
FIG. 6 is a flowchart illustrating a procedure to be taken in the process of the capacitance calculating unit.
Figure 7:
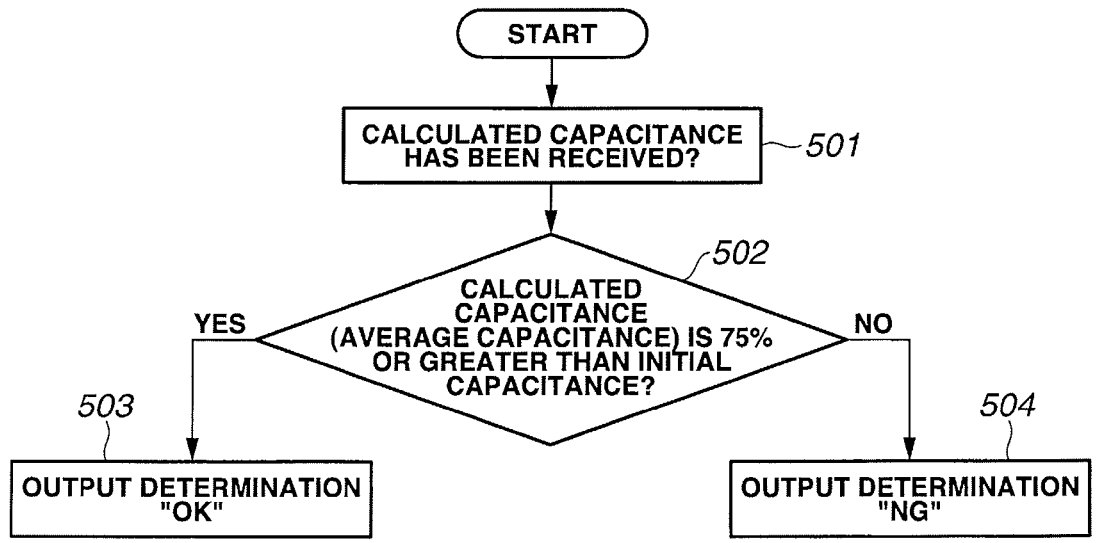
FIG. 7 is a flowchart illustrating a procedure to be taken in the process of the degradation determining unit.
Figure 8:
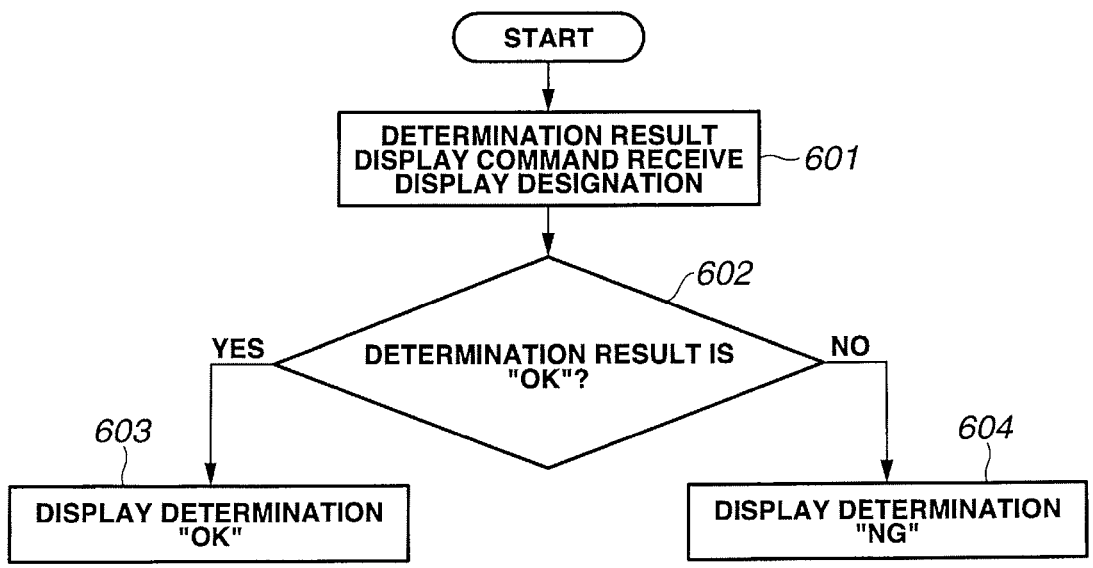
FIG. 8 is a flowchart illustrating a procedure to be taken in the process of the state display unit.
Figure 9:
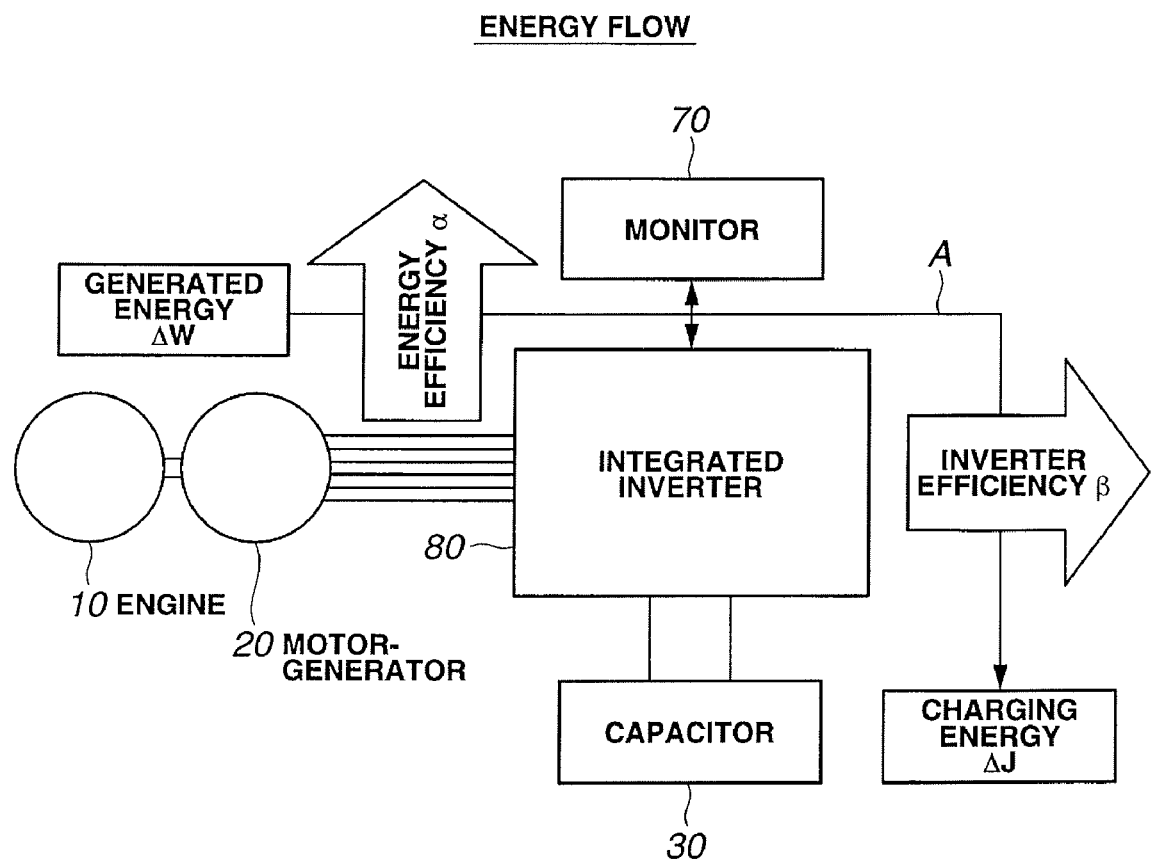
FIG. 9 illustrates an energy flow in the Embodiment.

The invention claimed is:

1. A method for determining a degradation state of an electrical storage device in hybrid construction equipment provided with an engine, a motor-generator, an electrical storage device, an electric power load, and a working machine driven by the electric power load, comprising:
a step of checking that at least the working machine has halted;
a step of shifting into a degradation state determination time control mode when it is checked that the working machine has halted, and increasing in the electrical storage device from a prescribed start charging voltage to a prescribed end charging voltage by driving the motor-generator at a prescribed rotational speed and with a prescribed torque;
a step of calculating a capacitance of the electrical storage device based on values of the rotational speed and the torque of the motor-generator during the degradation state determination time control mode, values of the start charging voltage and the end charging voltage of the electrical storage device, and a time required for the electrical storage device to reach the end charging voltage from the start charging voltage; and
a step of determining the degradation state of the electrical storage device by comparing the calculated capacitance of the electrical storage device with a reference capacitance.

2. The method for determining a degradation state of an electrical storage device in hybrid construction equipment according to claim 1, characterized in that
the capacitance of the electrical storage device is calculated after the capacitance is corrected by temperature of the electrical storage device during the degradation state determination time control mode.

3. The method for determining a degradation state of an electrical storage device in hybrid construction equipment according to claim 1, characterized in that
the charging operation to increase in the electrical storage device from the start charging voltage to the end charging voltage is performed a plurality of times during the degradation state determination time control mode; and
the degradation state of the electrical storage device is determined by calculating an average capacitance by averaging capacities of the electrical storage device of respective charging operations, and by comparing the average capacitance with the reference capacitance.

4. The method for determining a degradation state of an electrical storage device in hybrid construction equipment according to claim 1, characterized by further comprising a step of displaying a result of determination of the degradation state of the electrical storage device.

5. A device for determining a degradation state of an electrical storage device in hybrid construction equipment provided with:
an engine;
a motor-generator having a drive shaft that is connected to an output shaft of the engine, and performs an electric power generating action and an electric motor action;
an electrical storage device that stores electric power when the motor-generator performs the electric power generating action, and supplies the electric power to an electric power load and the motor-generator;
the electric power load; and
a working machine driven by the electric power load, characterized in that
the device for determining a degradation state of an electrical storage device comprises:
a voltage value detecting unit that detects a charging voltage value in the electrical storage device; and
a control device that performs a control for determining the degradation state of the electrical storage device, wherein
the control device comprises:
a state managing unit that checks that at least the working machine has halted, and outputs a command to shift into a degradation state determination time control mode when it is checked that the working machine has halted;

a charge and discharge control unit that performs a shift into the degradation state determination time control mode when the command is given from the state managing unit, and gives a control command to the engine and the motor-generator so that the motor-generator is driven at a prescribed rotational speed and with a prescribed torque in order to increase in the electrical storage device from a start charging voltage to an end charging voltage while taking in a charging voltage value of the electrical storage device detected by the voltage value detecting unit;

a capacitance calculating unit that calculates a capacitance of the electrical storage device based on values of the rotational speed and the torque of the motor-generator during the degradation state determination time control mode, values of the start charging voltage and the end charging voltage of the electrical storage device, and a time required for the electrical storage device to reach the end charging voltage from the start charging voltage; and a degradation determining unit that determines the degradation state of the electrical storage device by comparing the calculated capacitance of the electrical storage device with a reference capacitance.

6. The device for determining a degradation state of an electrical storage device in hybrid construction equipment according to claim 5, characterized by further comprising:

a temperature detecting unit that detects temperature of the electrical storage device, wherein the capacitance calculating unit calculates the capacitance of the electrical storage device after the capacitance is corrected by the temperature of the electrical storage device during the degradation state determination time control mode.

7. The device for determining a degradation state of an electrical storage device in hybrid construction equipment according to claim 5, characterized in that the charge and discharge control unit controls to perform a charging operation to increase in the electrical storage device from the start charging voltage to the end charging voltage a plurality of times, the capacitance calculating unit calculates an average capacitance by averaging capacities of the electrical storage device of respective charging operations, and the degradation determining unit determines the degradation state of the electrical storage device by comparing the average capacitance with the reference capacitance.

8. The device for determining a degradation state of an electrical storage device in hybrid construction equipment according to claim 5, characterized by further comprising a display device, wherein the control unit further comprises a state display unit for displaying a result of determination of the degradation state of the electrical storage device.

9. The device for determining a degradation state of an electrical storage device in hybrid construction equipment according to claim 5, characterized in that the electric power load is an electric motor for driving the working machine.

* * * * *